(12) United States Patent
Pagnanelli

(10) Patent No.: US 8,819,101 B2
(45) Date of Patent: Aug. 26, 2014

(54) MULTI-BIT SAMPLING AND QUANTIZING CIRCUIT

(75) Inventor: Christopher Pagnanelli, Huntington Beach, CA (US)

(73) Assignee: Syntropy Systems, LLC, Huntington Beach, CA (US)

( * ) Notice: Subject to any disclaimer, the term of this patent is extended or adjusted under 35 U.S.C. 154(b) by 525 days.

(21) Appl. No.: 13/227,668

(22) Filed: Sep. 8, 2011

(65) Prior Publication Data

US 2012/0056771 A1    Mar. 8, 2012

Related U.S. Application Data

(60) Provisional application No. 61/381,055, filed on Sep. 8, 2010.

(51) Int. Cl.
*G06G 7/00* (2006.01)
*H03M 1/36* (2006.01)

(52) U.S. Cl.
CPC .................................. *H03M 1/36* (2013.01)
USPC .......................................................... 708/801

(58) Field of Classification Search
CPC .......... G06G 7/14; G06J 1/00; G06N 3/0635; G06N 3/063; G06E 3/005
USPC .......................................................... 708/801
See application file for complete search history.

(56) References Cited

U.S. PATENT DOCUMENTS

| | | | | |
|---|---|---|---|---|
| 3,729,732 | A * | 4/1973 | Yano | 341/118 |
| 5,227,791 | A | 7/1993 | Zatler et al. | |
| 5,261,035 | A * | 11/1993 | Adler | 708/801 |
| 5,459,319 | A | 10/1995 | Norsworthy | |
| 5,805,022 | A * | 9/1998 | Bruccoleri et al. | 330/254 |
| 6,426,714 | B1 | 7/2002 | Ruha et al. | |
| 6,642,873 | B1 | 11/2003 | Kuang | |
| 2005/0052300 | A1 | 3/2005 | Ranganathan | |

FOREIGN PATENT DOCUMENTS

JP         05-206855         8/1993

OTHER PUBLICATIONS

International Search Report and Written Opinion for corresponding PCT application No. PCT/US2011/050735.

* cited by examiner

*Primary Examiner* — Tan V. Mai
(74) *Attorney, Agent, or Firm* — Joseph G. Swan, P.C.

(57) ABSTRACT

Provided are, among other things, systems, apparatuses methods and techniques for performing multi-bit quantization. One such apparatus includes an input signal line; a first comparator having a first input coupled to the input signal line, a second input coupled to a first reference signal, and an output; a rectifier having an input coupled to the input signal line and also having an output; and a second comparator having a first input coupled to the output of the rectifier, a second input coupled to a second reference signal, and an output, with the first comparator and the second comparator being clocked so as to produce sequences of quantized samples at substantially the same times.

15 Claims, 3 Drawing Sheets

US 8,819,101 B2

MULTI-BIT SAMPLING AND QUANTIZING CIRCUIT

This application claims the benefit of U.S. Provisional Patent Application Ser. No. 61/381,055, filed on Sep. 8, 2010, and also titled "Multi-Bit Sampling and Quantizing Circuit", which application is incorporated by reference herein as though set forth herein in full.

FIELD OF THE INVENTION

The present invention pertains to systems, apparatuses, methods and techniques for converting a continuous-time, continuously variable signal into a sampled, quantized discrete-time signal.

BACKGROUND

Many applications in modern electronics require that continuous-time signals be converted to discrete-time signals for processing using digital computers and signal processors. Typically, this conversion is made using a sampler/quantizer circuit that, at each of a sequence of uniform time intervals, rounds the value of a continuous-time, continuously-variable analog signal into one of a finite number of discrete values. This rounding operation typically is performed through the use of one or more voltage comparators, such as comparators 12-14 in the exemplary, conventional two-bit sampling circuit 10 illustrated in FIG. 1. Exemplary sampling circuit 10 sometimes is referred to as a Flash converter in the prior-art literature. Referring to FIG. 1, a resistor ladder (including equal-valued resistors 16 and 17) establish three uniformly spaced voltage thresholds 21-23 $V_{T+}$, $(V_{T+}+V_{T-})/2$ and $V_{T-}$, which are compared against the analog input signal voltage 30 in the three comparators 12-14 at each point in time identified by sampling signal 32. For a low input voltage, all three comparator outputs get latched in a low state, represented by a binary thermometer code of '000'. For a high input voltage, all three comparator outputs get latched in a high state, represented by a binary thermometer code of '111'. Therefore, the four possible thermometer codes that represent the four possible input voltage states are: '000', '001', '011', and '111'. The first (leftmost) bit in the thermometer code is determined by comparator 12, the second (middle) bit in the thermometer code is determined by comparator 13, and the third (rightmost) bit in the thermometer code is determined by comparator 14. A logic decoder 35 then converts each of the four possible thermometer codes into one of four binary (e.g., two's complement) values: '10', '11', '00', and '01'. In such a two-bit binary representation of an analog signal that is expected to vary between $|V_{max}|$ and $-|V_{max}|$, the first bit, or most significant bit (MSB), represents the sign of the analog signal; and the second bit, or least significant bit (LSB), represents the magnitude of the analog input signal.

While the conventional two-bit quantizing circuit is useful for its intended purpose, the present inventor has discovered that a reduced-complexity circuit can be implemented.

SUMMARY OF THE INVENTION

In particular, by introducing a passive or active circuit (preferably just a single such circuit) for performing signal rectification (e.g., full-wave rectification) prior to at least one comparator rounding operation, an improved multi-bit sampling circuit can be provided. Compared to a conventional multi-bit quantizer, a sampling circuit according to a preferred embodiment of the present invention reduces the number of comparators needed to produce L output quantization levels, from L−1 to L/2. Therefore, such a sampling circuit can be particularly advantageous when a large number of output quantization levels are desired or for use at very high sample rates, e.g., for instantaneous bandwidths approaching the Nyquist limit, where comparator power dissipation is significant.

Thus, one embodiment of the invention is directed to an apparatus that includes an input signal line; a first comparator having a first input coupled to the input signal line, a second input coupled to a first reference signal, and an output; a rectifier having an input coupled to the input signal line and also having an output; and a second comparator having a first input coupled to the output of the rectifier, a second input coupled to a second reference signal, and an output, with the first comparator and the second comparator being clocked so as to produce sequences of quantized samples at substantially the same times.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

DESCRIPTION OF THE PREFERRED EMBODIMENT(S)

Figure 1:
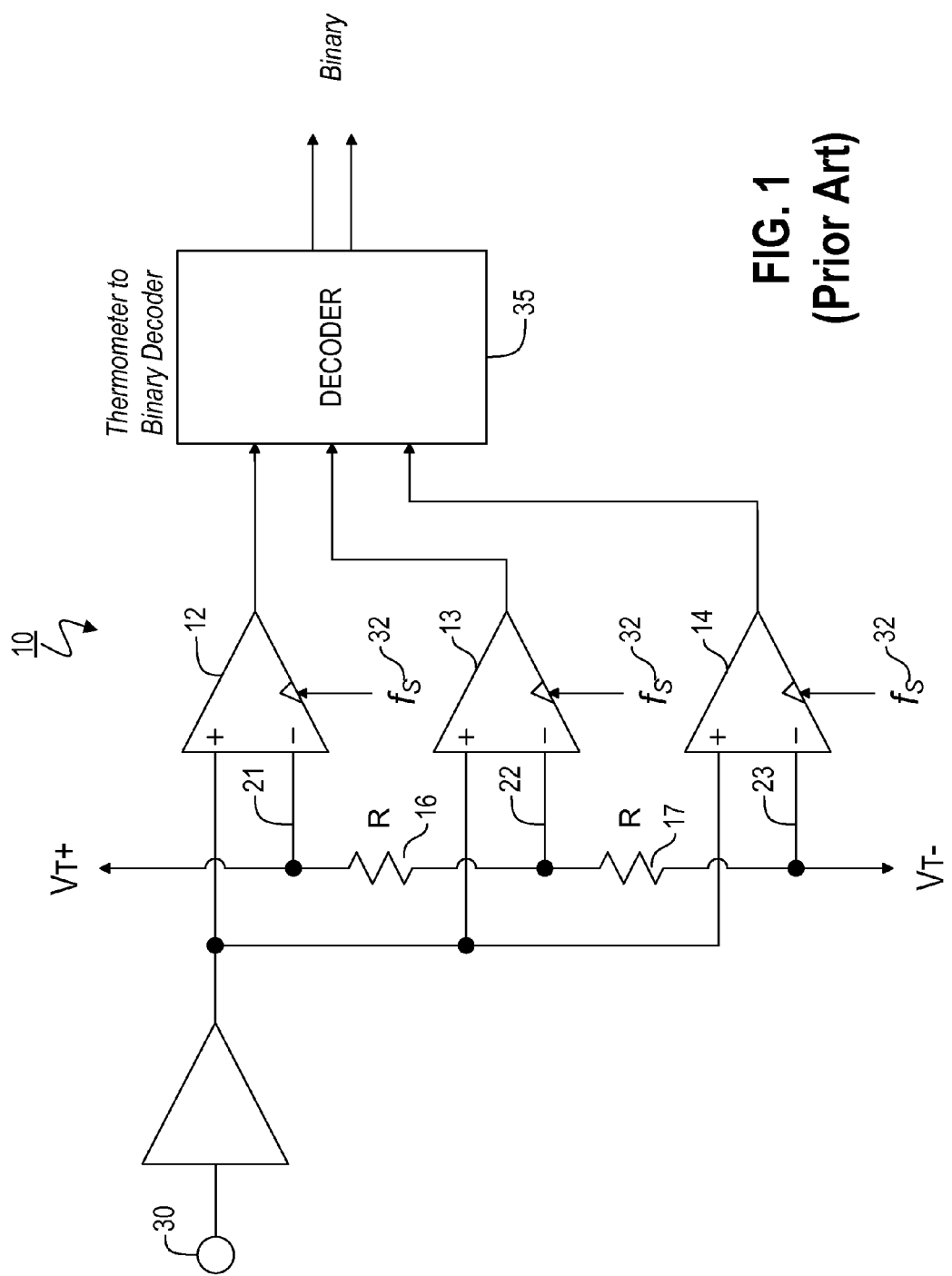
FIG. 1 is a block diagram of a conventional two-bit sampling/quantizing circuit having a resistor ladder, three comparators and a logic decoder for converting a thermometer code to a binary code.
Figure 2A:
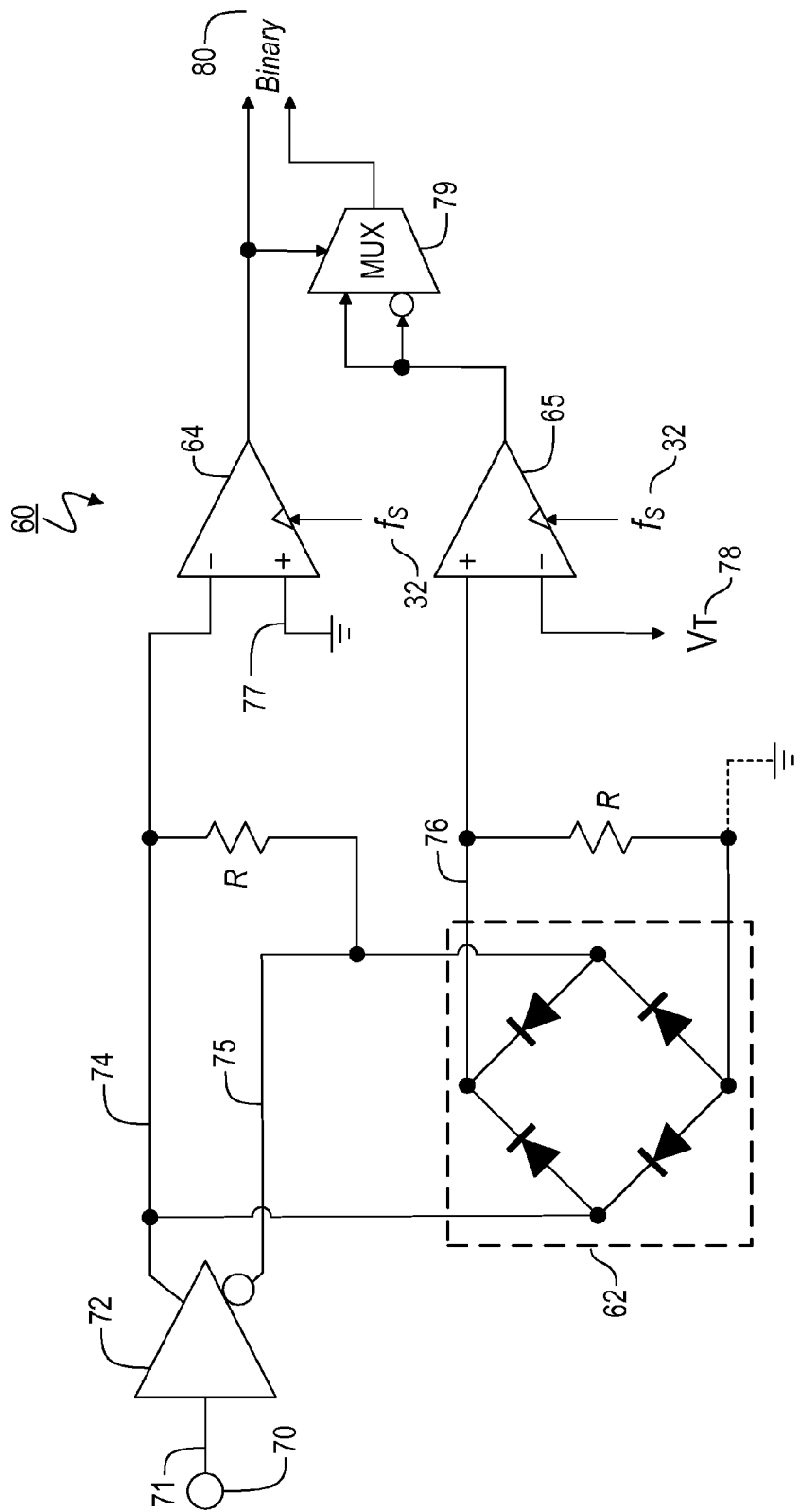
FIG. 2A is a block diagram of an exemplary, improved two-bit (4-level) sampling/quantizing circuit converter according to a representative embodiment of the present invention.
Figure 2B:
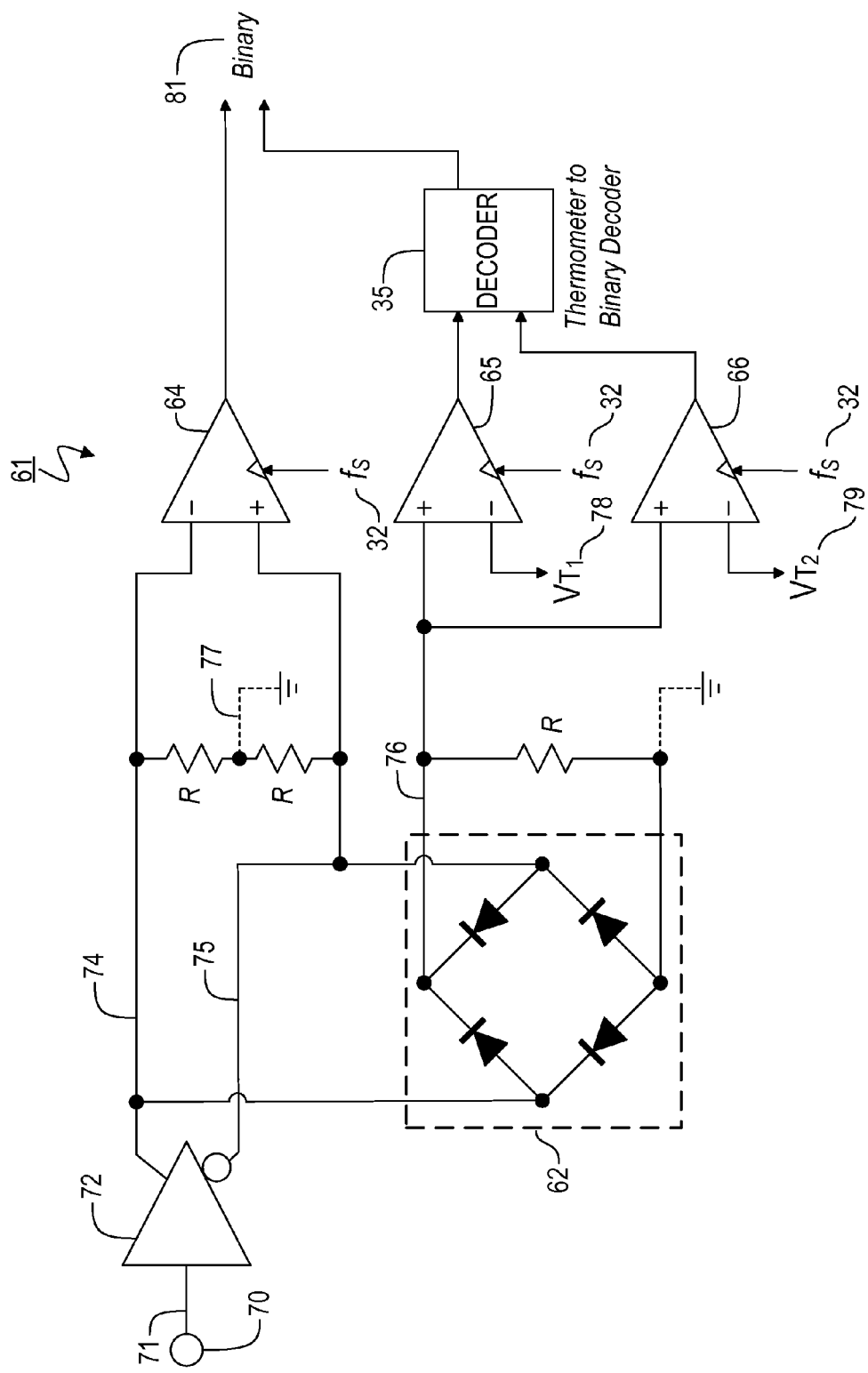
FIG. 2B is a block diagram of an exemplary, improved 6-level (2.5-bit) sampling/quantizing circuit converter according to a representative embodiment of the present invention.

A multi-bit sampling/quantization circuit 60 that typically is more efficient, in terms of required hardware and power efficiency, is shown in FIGS. 2A&B. Referring to the exemplary embodiment illustrated in FIG. 2A, circuit 60 incorporates a full-wave rectifier 62 at the sampler/quantizer input, so that two comparators 64 and 65, instead of three, can be used to round an analog input voltage 70 into a two-bit (4-level) binary representation 80. Referring to the exemplary embodiment illustrated in FIG. 2B, circuit 61 similarly incorporates a full-wave rectifier 62 at the sampler/quantizer input, so that three comparators 64 through 66, instead of five, can be used to round an analog input voltage 70 into a six-level binary representation 81.

Referring to FIG. 2A, a continuously variable, continuous-time analog signal 70 on input line 71 preferably is initially buffered (and potentially voltage amplified, as discussed in greater detail below) by an amplifier 72. It is noted that input line 71 can be implemented, e.g., as a physical port for accepting an external signal or as an internal wire, conductive trace or a similar conductive path for receiving a signal from another circuit within the same device. It is further noted that amplifier 72 can be omitted in alternate embodiments of the invention, e.g., where the input signal 70 already is of adequate amplitude and strength. In any event, the input signal line 71 preferably is coupled to comparator 64 and also, through rectifier 62, to comparator 65. As used herein, the term "coupled", or any other form of the word, is intended to mean either directly connected or connected through one or more other processing blocks, e.g., for the purpose of preprocessing.

In the preferred embodiments, the output of amplifier 72 is directly input to comparator 64 and rectifier 62. Here, rectifier 62 is a full-wave rectifier. However, in alternate embodiments where, as here, both the buffered signal 74 and its negative 75 are available, two half-wave rectifiers instead can be used (to obtain the positive portion of buffered signal 74 and the positive portion of its negative 75). Furthermore, rectifier 62 is shown as a passive, diode rectifier. However, in alternate embodiments, rectifier 62 can be implemented as a conventional active rectifier to eliminate the forward voltage losses associated with diode rectifiers. The comparator 64 compares the signal 74 to a reference signal 77, which is ground in the present embodiment and, therefore, directly determines the sign, or most significant bit (MSB), of the analog input signal 70 voltage.

Referring to circuit 60 in FIG. 2A, the rectifier 62 produces at its output 76 the absolute value of the analog signal 74 (or its negative 75), less a (typically fixed) voltage drop ($V_D$) caused by the diodes comprising rectifier 62. The output signal 76 of rectifier 62 is then input to comparator 65 where it is compared to reference signal 78, which in the present embodiment is a fixed threshold voltage $V_T$. As a result, in the present embodiment, the comparator 65 provides information regarding the magnitude, or least significant bit (LSB), of the analog input signal voltage 70. For this purpose, for an analog input signal 70 that is expected to vary between $|V_{max}|$ and $-|V_{max}|$ (or for quantizer 60 that are intended to accommodate signals up to $|V_{max}|$), $V_T$ preferably is set equal to $|V_{max}|/2-V_D$. However, in alternate embodiments, e.g., where non-uniform quantization is desired, $V_T$ can be set to any other value, e.g., between 0 and $|V_{max}|$. Similar processing occurs in circuit 61, shown in FIG. 2B, except that in this alternate embodiment, the output signal 76 of rectifier 62 is input to two comparators (i.e., comparators 65 and 66) where it is compared to two reference signals (i.e., reference signals 78 and 79), which are fixed threshold voltages of $V_{T_1}$ and $V_{T_2}$, respectively. In this alternate embodiment, comparators 65 and 66 provide, with finer granularity, information regarding the magnitude of the analog input signal voltage 70. Other embodiments, comprising more than three comparators and/or outputting more than six levels, also should be considered within the scope of the invention.

As with the conventional sampler/quantizer 10 described above, the comparators in the present invention (e.g., comparators 64 and 65 in circuit 60 and comparators 64 to 66 in circuit 61) preferably are supplied with the same sampling signal 32, or are otherwise clocked in a manner such that they produce sequences of quantized samples at the same (or substantially the same) points in time. For samples when the analog input signal voltage 70 is less than zero (negative), the output of comparator 64 gets latched to a high state of '1', and for samples when the analog input signal voltage 70 is greater than zero (positive), the output of comparator 64 gets latched to a low state of '0'. Referring to circuit 60 in FIG. 2A, when the output signal 76 of rectifier 62, which indicates the magnitude of the analog input signal voltage 70, is greater than the threshold voltage 78, $V_T$, the output of comparator 65 gets latched to a high state of '1', and when the output signal 76 of rectifier 62 is less than the threshold voltage 78, $V_T$, the output of comparator 65 gets latched to a low state of '0'. Depending on its sign and magnitude, therefore, the analog input signal voltage is represented by four possible comparator states: '11', '10', '00', and '01'. The first bit (MSB) of each comparator state is determined the first comparator, and the second bit (LSB) of each comparator state is determined by the second comparator. Referring to circuit 61 in FIG. 2A, when the output signal 76 of rectifier 62, which indicates the magnitude of the analog input signal voltage 70, is greater than the threshold voltage 78, $V_{T_1}$, the output of comparator 65 gets latched to a high state of '1', and when the output signal 76 of rectifier 62 is less than the threshold voltage 78, $V_{T_1}$, the output of comparator 65 gets latched to a low state of '0'. Similarly, when the output signal 76 of rectifier 62 is greater than the threshold voltage 79, $V_{T_2}$, the output of comparator 66 gets latched to a high state of '1', and when the output signal 76 of rectifier 62 is less than the threshold voltage 79, $V_{T_2}$, the output of comparator 66 gets latched to a low state of '0'. Depending on its sign and magnitude, therefore, the analog input signal voltage is represented by six possible comparator states: '111', '110', '101', '000', '001', and '010'.

In the exemplary embodiment illustrated in FIG. 2A, the outputs of comparators 64 and 65 preferably are then input into a simple multiplexer 79, which inverts the LSB when the MSB is in a high state of '1', but does not invert the LSB when the MSB is in a low state of '0'. This operation converts, or reorders, the foregoing four possible comparator states into four binary (two's complement) values: '10', '11', '00', and '01', respectively. Accordingly, in the present embodiment the final output of the sampler/quantizer 60 is converted to a conventional two's complement format, where the output of comparator 64 is the MSB and the output of multiplexer 79 is the LSB. In the alternate embodiment illustrated in FIG. 2B, the outputs of comparators 65 and 66 preferably are input to a conventional thermometer-to-binary decoder 35, such that the output of decoder 35 is a binary representation of the magnitude of input signal 70. Then the output of comparator 64 is taken directly as a single bit representing the sign of the input signal 70. Accordingly, in this alternate embodiment the final output of the sampler/quantizer 61 is converted to a conventional sign/magnitude format, where the output of comparator 64 (which is the MSB) contains sign information and the output of decoder 35 (which are the LSBs) contains magnitude information. Other forms of conventional output formatting instead can be used and should be considered within the scope of the invention.

It will be readily appreciated that any portion of the signal 74 (i.e., the input into rectifier 62) that is less than $V_D$ will be permanently lost (set to 0) if rectifier 62 is implemented as a diode bridge. For this reason, if $|V_{max}|$ of the original input signal 70 is less than $2 \cdot V_D$, amplifier 72 preferably includes sufficient voltage amplification so that $|V_{max}|$ of signal 74 is at least equal to $2 \cdot V_D$, i.e., so that $V_T$ is at least 0. As a result of such voltage amplification, no additional information is lost through the inclusion of rectifier 62 (i.e., no information that would not have been lost anyway as a result of the coarseness of using two-bit quantization). Alternatively, it will be readily appreciated that active rectifiers, such as those implemented using operational amplifiers, active multipliers, or other conventional circuits that calculate absolute value, can be employed to increase the sensitivity of the improved sampler/quantizer and prevent loss of information due to forward diode voltage drop.

ADDITIONAL CONSIDERATIONS

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for performing multi-bit quantization, comprising:
    an input signal line;
    a first comparator having a first input coupled to the input signal line, a second input coupled to a first reference signal, and an output;
    a rectifier having an input coupled to the input signal line and also having an output;
    a second comparator having a first input coupled to the output of the rectifier, a second input coupled to a second reference signal, and an output; and
    a multiplexer having a signal-select input coupled to the output of the first comparator, a first input coupled to the output of the second comparator, a second input coupled to the output of the second comparator, and an output,
    wherein the first comparator and the second comparator are clocked so as to produce sequences of quantized samples at substantially the same times.

2. An apparatus according to claim 1, wherein the first reference signal is ground.

3. An apparatus according to claim 1, wherein a quantized output of said apparatus comprises the output of the first comparator and the output of the multiplexer.

4. An apparatus according to claim 1, wherein the second reference signal is a fixed voltage.

5. An apparatus according to claim 4, wherein the second reference signal is equal to one half of a maximum accommodated signal magnitude less a fixed voltage drop across the rectifier.

6. An apparatus according to claim 1, wherein the rectifier includes at least one diode.

7. An apparatus according to claim 1, wherein the rectifier comprises an active circuit.

8. An apparatus for performing multi-bit quantization, comprising:
    an input signal line;
    a first comparator having a first input coupled to the input signal line, a second input coupled to a first reference signal, and an output;
    a rectifier having an input coupled to the input signal line and also having an output;
    a second comparator having a first input coupled to the output of the rectifier: a second input coupled to a second reference signal, and an output; and
    a third comparator having a first input coupled to the output of the rectifier, a second input coupled to a third reference signal, and an output,
    wherein the first comparator and the second comparator are clocked so as to produce sequences of quantized samples at substantially the same times.

9. An apparatus according to claim 8, further comprising a decoder having inputs that are coupled to the outputs of the second and third comparators, and also having an output.

10. An apparatus according to claim 8, wherein the second reference signal is a fixed voltage.

11. An apparatus according to claim 10, wherein the second reference signal is equal to one half of a maximum accommodated signal magnitude less a fixed voltage drop across the rectifier.

12. An apparatus according to claim 8, wherein the rectifier includes at least one diode.

13. An apparatus according to claim 8, wherein the rectifier comprises an active circuit.

14. An apparatus according to claim 8, wherein the first reference signal is the negative of the signal provided to the first input of the first comparator.

15. An apparatus according to claim 8, wherein the third reference signal is a fixed voltage.

* * * * *